United States Patent
Katsuragawa et al.

(10) Patent No.: US 9,548,232 B2
(45) Date of Patent: Jan. 17, 2017

(54) ATTACHING APPARATUS

(71) Applicant: Tokyo Ohka Kogyo Co., Ltd., Kawasaki-shi (JP)

(72) Inventors: Junichi Katsuragawa, Kawasaki (JP); Yoshihiro Inao, Kawasaki (JP); Shigeru Kato, Kawasaki (JP)

(73) Assignee: TOKYO OHKA KOGYO CO., LTD., Kawasaki-shi (JP)

( * ) Notice: Subject to any disclaimer, the term of this patent is extended or adjusted under 35 U.S.C. 154(b) by 266 days.

(21) Appl. No.: 14/408,903

(22) PCT Filed: May 7, 2013

(86) PCT No.: PCT/JP2013/062816
§ 371 (c)(1),
(2) Date: Dec. 17, 2014

(87) PCT Pub. No.: WO2013/190926
PCT Pub. Date: Dec. 27, 2013

(65) Prior Publication Data
US 2015/0325463 A1    Nov. 12, 2015

(30) Foreign Application Priority Data

Jun. 20, 2012   (JP) .................................. 2012-139213

(51) Int. Cl.
*B32B 37/00*    (2006.01)
*H01L 21/683*   (2006.01)
(Continued)

(52) U.S. Cl.
CPC ......... *H01L 21/683* (2013.01); *B32B 37/0046* (2013.01); *B32B 37/10* (2013.01);
(Continued)

(58) Field of Classification Search
CPC ............. H01L 21/683; H01L 21/67092; H01L 21/67288; B32B 37/0046
(Continued)

(56) References Cited

U.S. PATENT DOCUMENTS 6,081,414 A      6/2000 Flanigan et al.
2002/0083849 A1  7/2002 Ohta et al.
(Continued)

FOREIGN PATENT DOCUMENTS

JP    07-335512    12/1995
JP    9-316399     12/1997
(Continued)

OTHER PUBLICATIONS

First Office Action in Korean Patent Application No. 2015-7000444, mailed Dec. 2, 2015.
(Continued)

*Primary Examiner* — James Sells
(74) *Attorney, Agent, or Firm* — Knobbe Martens Olson & Bear LLP

(57) ABSTRACT

An attaching apparatus, a substrate and a support that can be uniformly attached through an adhesive layer. The attaching apparatus is equipped with a set plate and a press plate formed of ceramics. The set plate and the press plate have a flatness of 1.0 μm or less when not pressed.

8 Claims, 2 Drawing Sheets

(51) Int. Cl.
  *B32B 37/10* (2006.01)
  *H01L 21/67* (2006.01)
  *B32B 37/12* (2006.01)
  *B32B 41/00* (2006.01)
(52) U.S. Cl.
  CPC .. *H01L 21/67092* (2013.01); *H01L 21/67288* (2013.01); *B32B 37/12* (2013.01); *B32B 41/00* (2013.01); *B32B 2457/14* (2013.01)
(58) Field of Classification Search
  USPC ..................................... 156/580, 581, 583.1
  See application file for complete search history.

(56) References Cited

U.S. PATENT DOCUMENTS

| | | | |
|---|---|---|---|
| 2004/0040665 A1 | 3/2004 | Mizuno et al. | |
| 2006/0000802 A1* | 1/2006 | Kumar | H01J 37/32357 216/67 |
| 2006/0158823 A1 | 7/2006 | Mizuno et al. | |
| 2007/0158026 A1* | 7/2007 | Amikura | C23C 16/455 156/345.34 |
| 2008/0236492 A1 | 10/2008 | Yamazawa | |
| 2009/0059462 A1 | 3/2009 | Mizuno et al. | |
| 2009/0104750 A1 | 4/2009 | Yamazaki et al. | |
| 2009/0122459 A1 | 5/2009 | Mizuno et al. | |
| 2010/0039747 A1 | 2/2010 | Sansoni et al. | |
| 2010/0046134 A1 | 2/2010 | Mizuno et al. | |
| 2011/0253311 A1* | 10/2011 | Muraoka | C23C 16/4586 156/345.41 |
| 2011/0308721 A1 | 12/2011 | Broekaart et al. | |
| 2012/0055403 A1 | 3/2012 | Gomi et al. | |
| 2012/0067524 A1 | 3/2012 | Broekaart et al. | |
| 2012/0305185 A1* | 12/2012 | Singh | H01J 37/32082 156/345.3 |
| 2013/0032272 A1 | 2/2013 | Broekaart et al. | |
| 2013/0153116 A1 | 6/2013 | Hirakawa et al. | |
| 2014/0209250 A1* | 7/2014 | Kawagoe | B32B 43/006 156/701 |
| 2015/0279830 A1 | 10/2015 | Broekaart et al. | |

FOREIGN PATENT DOCUMENTS

| | | |
|---|---|---|
| JP | 11-74319 A | 3/1999 |
| JP | 2002/514010 A | 5/2002 |
| JP | 2002-192394 | 7/2002 |
| JP | 2002-323694 | 11/2002 |
| JP | 2003-241157 | 8/2003 |
| JP | 2003-347360 | 12/2003 |
| JP | 2004-268113 A | 9/2004 |
| JP | 2004-349612 | 12/2004 |
| JP | 2007-121639 | 5/2007 |
| JP | 2008/244063 A | 10/2008 |
| JP | 4245138 | 3/2009 |
| JP | 2009-135451 | 6/2009 |
| JP | 2011-192661 A | 9/2011 |
| JP | 2012-39089 A | 2/2012 |
| JP | 2012-069900 | 4/2012 |
| KR | 2004/0002552 | 1/2004 |
| KR | 2008/0002323 A | 1/2008 |
| KR | 2009/0105367 A | 10/2009 |
| KR | 2010/0039793 A | 4/2010 |
| KR | 2011/0049867 A | 5/2011 |
| KR | 2012/0012225 A | 2/2012 |
| TW | 200417796 | 9/2004 |

OTHER PUBLICATIONS

Office Action in corresponding Japanese Patent Application No. 2012-139213, dated Dec. 22, 2015.
Office Action in Taiwan Patent Application No. 102117203, mailed Apr. 20, 2015.
Office Action in corresponding Japanese Patent Application No. 2012-139213, dated Oct. 20, 2015.
International Search Report issued in PCT/JP2013/062816 on Jun. 4, 2013.
Decision to Dismiss the Amendment of Corresponding Japanese Application No. 2012-139213, dated Feb. 16, 2016.

* cited by examiner

ATTACHING APPARATUS

This application is the U.S. National Phase under 35 U.S.C. §371 of International Application No. PCT/JP2013/062816, filed May 7, 2013, designating the U.S., and published in Japanese as WO 2013/190926 on Dec. 27, 2013, which claims priority to Japanese Patent Application No. 2012-139213, filed Jun. 20, 2012, the entire contents of which is incorporated herein by reference.

TECHNICAL FIELD

The present invention relates to an attaching apparatus for attaching a substrate and a support to each other through an adhesive layer by applying a pressure force.

BACKGROUND ART

As an attaching technique for attaching a substrate and a support through an adhesive layer, for example, PTL 1 discloses a pressing method of inorganic substrates in which a set combined with a laminate material including an inorganic substrate formed of semiconductors or ceramics and an auxiliary material for laminating is installed between a pair of upper and lower heating plates heated to a predetermined temperature in a decompressing press, and after the pair of heating plates is brought into contact with the combined set, at least, a low-pressure load from the start of pressing to 0.05 MPa is applied for 10 seconds or longer.

CITATION LIST

Patent Literature

[PTL 1] JP-A-2002-192394 (published on Jul. 10, 2002)

SUMMARY OF INVENTION

Technical Problem

However, for example, in a case of using a pressing method in the related art as described in PTL 1 in order to attach a substrate such as a wafer substrate and a support for supporting the substrate through an adhesive layer to each other, the following problems occur. That is, a heating plate used in a general decompressing press is configured with a metal, and fine unevenness is formed on the surface thereof. For this reason, when attaching a substrate and a support to each other using the heating plate, there is concern that the substrate may be damaged. In addition, in order to uniformly attach a substrate and a support to each other, as the size of the substrate is increased, it is necessary to increase a pressure force by the heating plate. For this reason, it is necessary to increase a pressure force when a pair of upper and lower heating plates push each other, and due to this, the heating plate itself is bent by the pressure force. If the plate itself is bent, even when the pressure force is released, the flatness of the surface of the plate is reduced, and thus, the adhesive layer is less likely to have a uniform thickness between the substrate and the support, therefore, it is difficult to uniformly attach the substrate and the support to each other, in particular, uniformly attach the end portion of the substrate to the support. In addition, if the flatness of the heating plate surface is reduced, concern that the substrate may be damaged also increases.

The present invention has been accomplished in consideration of the above-described problems, and a main object of the present invention is to provide an attaching apparatus by which concern that the substrate may be damaged can be avoided, and a substrate and a support can be uniformly attached to each other through an adhesive layer.

Solution to Problem

In order to solve the above problems, according to the present invention, there is provided an attaching apparatus for attaching a substrate and a support through an adhesive layer by applying a pressure force to a laminate formed by laminating the substrate, the adhesive layer, and the support for supporting the substrate in this order, which includes a pair of plate members for sandwiching the laminate and applying a pressure force to the laminate and a strut member for supporting the plate member, in which a portion being in contact with the laminate in the plate member is formed of ceramics, and the plate member has a flatness of 1.0 µm or less when the portion thereof being in contact with the laminate is not pressed.

Advantageous Effects of Invention

According to the attaching apparatus of the present invention, a portion being in contact with a laminate in the plate member is formed of ceramics, and the plate member has a flatness of 1.0 µm or less when the portion thereof being in contact with the laminate is not pressed, and thus, it is possible to avoid concern that the substrate may be damaged when pressed. Therefore, it is possible to provide an attaching apparatus by which a substrate and a support can be uniformly attached through an adhesive layer.

DESCRIPTION OF EMBODIMENTS

Figure 1:
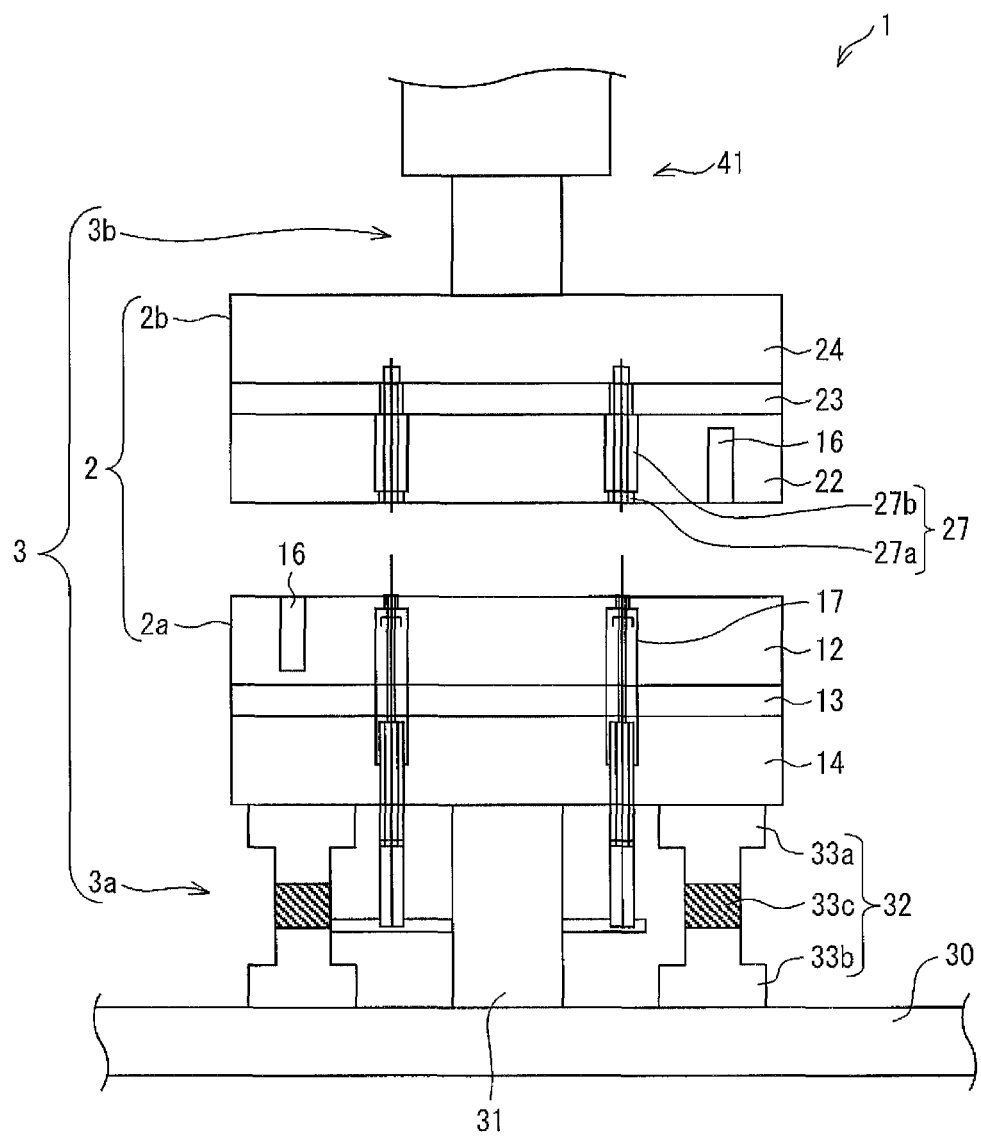
FIG. 1 is a front view showing a schematic configuration of an attaching apparatus according to an embodiment of the present invention.

The attaching apparatus according to the present invention is an attaching apparatus for attaching a substrate and a support through an adhesive layer by applying a pressure force to the laminate formed by laminating the substrate, the adhesive layer, and the support for supporting the substrate in this order, and is equipped with a pair of plate members for sandwiching a laminate and applying a pressure force to the laminate and a strut member for supporting the plate member, and a portion being in contact with the laminate in the plate member is formed of ceramics, and the plate member has a flatness of 1.0 µm or less when the portion thereof being in contact with the laminate is not pressed.

[Laminate]

A laminate to be attached is formed by laminating a substrate, an adhesive layer containing for example, a thermoplastic resin, and a support plate (support) for supporting the substrate in this order. That is, a laminate is formed by coating any one of a substrate and a support plate with an adhesive and laminating the substrate, the adhesive layer, and the support plate in this order. Then, the laminate, after being formed by laminating in advance, is set at a predetermined position of the attaching apparatus, for example, by a carrying device such as a robot arm. The laminate, in a state of being formed by laminating in advance, is more preferably temporarily fixed such that the relative position of the substrate and the support plate is not displaced. Alternatively, the laminate may be set at a predetermined position of the attaching apparatus by being formed by laminating the substrate and the support plate on the plate member of the attaching apparatus, for example, by a carrying device such as a robot arm.

Moreover, a forming method and a forming device for forming a laminate, that is, a forming method of an adhesive layer or an adhesive layer forming device, and a method for superposing a substrate and a support plate or an device for superposing are not particularly limited, and various methods and devices can be adopted. For example, as a forming method of an adhesive layer, it is also possible to form an adhesive layer by attaching an adhesive tape in which an adhesive is coated to any one of a substrate and a support plate. In the present invention, the laminate may be formed by laminating a substrate, an adhesive layer, and a support plate in this order at the time of applying pressure force by the attaching apparatus.

The substrate is subjected to processes such as thinning, carrying, mounting, and the like in a state of being supported (attached) by a support plate. The substrate is not limited to a wafer substrate, and for example, any substrate such as a ceramic substrate, a thin film substrate, a flexible substrate, and the like which are required to be supported by a support plate may be used.

The support plate is a support for supporting a substrate, and is attached to a substrate through an adhesive layer. Therefore, the support plate may have strength necessary to prevent the substrate from being damaged or deformed at the time of processes such as thinning, carrying, and mounting of the substrate, and is desirably a lighter one. From the viewpoints as described above, the support plate is more preferably configured with glass, silicon, an acryl-based resin, or the like.

An adhesive configuring the adhesive layer may include a thermoplastic resin in which thermal fluidity is improved, for example, by heating, as an adhesive material. Examples of the thermoplastic resin include an acryl-based resin, a styrene-based resin, a maleimide-based resin, a hydrocarbon-based resin, and an elastomer.

The forming method of an adhesive layer, that is, a coating method for coating a substrate or a support plate with an adhesive, or the forming method for forming an adhesive tape by coating a base material with an adhesive is not particularly limited, and examples of the coating method of an adhesive include a spin coating method, a dipping method, a roller blade method, a doctor blade method, a spraying method, and a coating method by a slit nozzle.

The thickness of an adhesive layer may be suitably set depending on the type of the substrate and the support plate to be attached, a step on the substrate surface, and a treatment to be performed on the substrate after attaching. For example, when considered based on the step on the substrate surface, the thickness is preferably in a range of about 1.1 times to 1.3 times.

Moreover, when removing a support plate from a substrate, the adhesive layer may be dissolved by supplying a solvent to the adhesive layer. As a result, it is possible to separate the substrate and the support plate. At this time, if a through hole penetrating in the thickness direction is formed in the support plate, it is possible to easily supply a solvent to the adhesive layer through the through hole, and thus, this is more preferable.

In addition, layers other than the adhesive layer may be further formed between the substrate and the support plate as long as attachment is not hindered. For example, a release layer altered by irradiation with light may be formed between the support plate and the adhesive layer. Due to the formed release layer, it is possible to easily separate the substrate and the support plate by irradiation of light after a process such as thinning, carrying, or mounting of the substrate.

[Attaching Apparatus]

Figure 2:
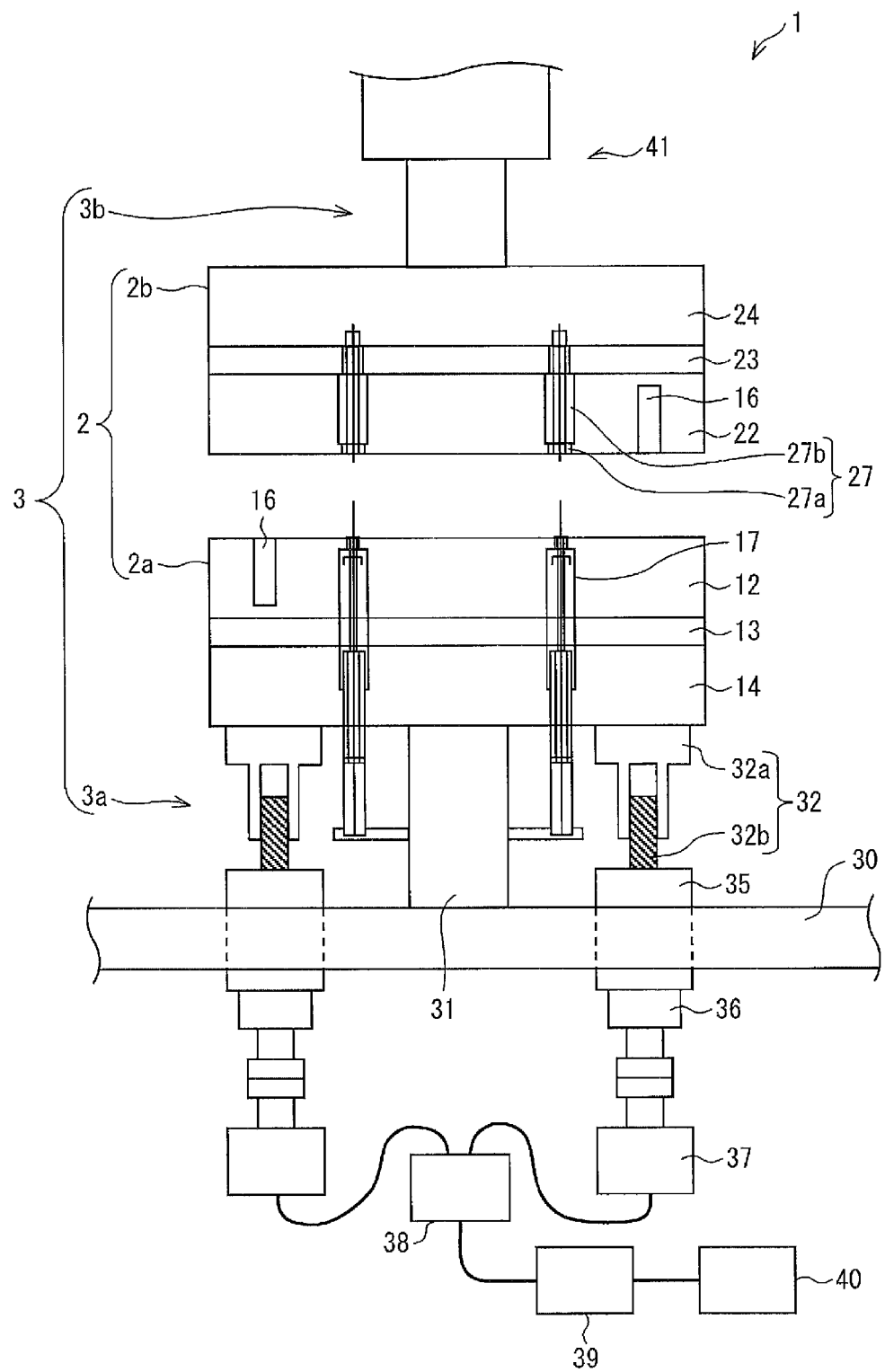
FIG. 2 is a front view showing another schematic configuration of the attaching apparatus according to an embodiment of the present invention.

Next, the attaching apparatus according to the embodiment will be described with reference to FIGS. 1 and 2. As shown in FIGS. 1 and 2, an attaching apparatus 1 according to the embodiment is equipped with a pair of plate members 2 for sandwiching the laminate (not shown) and a strut member 3 for supporting the plate member 2. The attaching apparatus 1 is housed in a chamber (not shown) which can be sealed at the time of attaching and of which the inside can be made to be a reduced pressure environment using a suction device or the like. Here, the attaching apparatus 1 in FIG. 1 shows a configuration in a case of manually maintaining the flatness of a set plate 12 when pressed described below, and the attaching apparatus 1 in FIG. 2 shows a configuration in a case of automatically maintaining the flatness. Hereinafter, common configurations are given like reference numerals.

The plate member 2 has a disk-shaped appearance, and is configured with a lower side plate member 2a and an upper side plate member 2b which are vertically arranged.

The lower side plate member 2a is configured with the set plate 12 which is a portion being in contact with a laminate, and on which a laminate is set, for example, in a state in which the substrate side of the laminate faces downward, a support plate 14 which is a portion fixed to a center supporting member 31 of a lower side supporting member 3a of the strut member 3, and a middle plate 13 provided between the set plate 12 and the support plate 14. The set plate 12 and the middle plate 13 are formed of ceramics such as alumina. In addition, a heating device (not shown) such as a surface heater or a ribbon heater which heats a laminate to 23° C. to 300° C. when pressed by heating the lower side plate member 2a is sandwiched between the set plate 12 and the middle plate 13. That is, the lower side plate member 2a has a heating device. The support plate 14 is formed of a metal such as stainless steel, ceramics, or stone. Therefore, the middle plate 13 has a function as an insulator which prevents a short circuit between the heating device and the support plate 14. In addition, since the support plate 14 is formed of a metal, the lower side plate member 2a is easily fixed to the lower side supporting member 3a. Moreover, the set plate 12, the middle plate 13, and the support plate 14 are fixed to each other with a plurality of bolts and nuts. Therefore, in a case where the support plate 14 is formed of a metal, fixing with bolts and nuts is easy.

The surface of the set plate 12 is formed such that the flatness becomes 1.0 μm or less when not pressed. Here, the flatness is a numerical value showing a degree of unevenness in the plane, and "flatness is 1.0 μm or less" indicates that unevenness of the surface of the set plate 12 (and a press plate 22 described below) when not pressed is ±1.0 μm or less. In addition, the set plate 12 has a thickness (thickness in the vertical direction) of, for example, 35 mm or greater such that the amount of deflection when pressed can be decreased. Since the set plate 12 is formed of ceramics, the flatness of the surface thereof can be easily processed so as to be 1.0 μm or less. In addition, since ceramics have a small thermal expansion coefficient in comparison with a metal, bending or distortion of the surface of the set plate 12 and the surface of the press plate 22 when pressed in a heating state is reduced, that is, bending or distortion is less likely to occur, and thus, planarity (horizontality) of each of the above surfaces can be maintained.

The lower side plate member 2*a* is further equipped with a thermometer 16, for example, formed of a thermocouple, for measuring the temperature of the surface of the set plate 12 and a plurality of carrying pins 17 for lifting the laminate when carrying the laminate, at portions in contact with the laminate in the set plate 12, to facilitate carrying operation by a carrying device.

The upper side plate member 2*b* is configured with the press plate 22 which is a portion being in contact with the laminate for pressing the support plate, a support plate 24 which is a portion fixed to a center supporting member 41 of the upper side supporting member 3*b* of the strut member 3, and a middle plate 23 provided between the press plate 22 and the support plate 24. The press plate 22 and the middle plate 23 are formed of ceramics such as alumina. In addition, a heating device (not shown) such as a surface heater or a ribbon heater which heats a laminate to 23° C. to 300° C. when pressed by heating the upper side plate member 2*b* is sandwiched between the press plate 22 and the middle plate 23. That is, the upper side plate member 2*b* has a heating device. The support plate 24 is formed of a metal such as stainless steel, ceramics, or stone. Therefore, the middle plate 23 has a function as an insulator which prevents a short circuit between the heating device and the support plate 24. In addition, since the support plate 24 is formed of a metal, the upper side plate member 2*b* is easily fixed to the upper side supporting member 3*b*. Moreover, the press plate 22, the middle plate 23, and the support plate 24 are fixed to each other with a plurality of bolts and nuts. Therefore, in a case where the support plate 24 is formed of a metal, fixing with bolts and nuts is easy.

The surface of the press plate 22 is formed such that the flatness becomes 1.0 μm or less when not pressed. In addition, the press plate 22 has a thickness (thickness in the vertical direction) of, for example, 35 mm or greater such that the amount of deflection when pressed can be decreased. Since the press plate 22 is formed of ceramics, the flatness of the surface thereof can be easily processed so as to be 1.0 μm or less.

The upper side plate member 2*b* is further equipped with a thermometer 16, for example, formed of a thermocouple, for measuring the temperature of the surface of the press plate 22 and a plurality of prevention members 27 for preventing the laminate from attaching to the upper side plate member 2*b* at the portion being in contact with the laminate in the press plate 22.

The strut member 3 is configured with the lower side supporting member 3*a* for supporting the lower side plate member 2*a* and the upper side supporting member 3*b* for supporting the upper side plate member 2*b* which are vertically arranged. The lower side supporting member 3*a* and the upper side supporting member 3*b* are formed of a metal such as stainless steel.

The lower side supporting member 3*a* is configured with the center supporting member 31, which is fixed to a base 30, for supporting at least the center portion of the lower side plate member 2*a* and a plurality of peripheral supporting members 32, which are fixed to the base 30, for supporting portions other than the center portion of the lower side plate member 2*a*. The lower side supporting member 3*a* supports the lower side plate member 2*a* such that the surface of the set plate 12 becomes horizontal. Though the diameter of the center supporting member 31 may have strength necessary to support the lower side plate member 2*a* when pressed, the diameter is desirable to be thinner such that the heat of the lower side plate member 2*a* does not escape. The number of the peripheral supporting members 32 which the lower side supporting member 3*a* has is preferably in a range of 3 to 10, and more preferably 6 or 8 to prevent the heat of the lower side plate member 2*a* from escaping and to support the entire lower side plate member 2*a* in a well-balanced manner. The plurality of the peripheral supporting members 32 are arranged at the same interval to each other to support the entire lower side plate member 2*a* in a well-balanced manner, that is, so as to be capable of maintaining horizontality of the surface of the set plate 12. Though the diameter of the peripheral supporting member 32 may have strength necessary to decrease the amount of deflection of the lower side plate member 2*a* when pressed, the diameter is desirable to be thinner such that the heat of the lower side plate member 2*a* does not escape.

In the attaching apparatus 1 shown in FIG. 1, the peripheral supporting member 32 is configured with an upper supporting member 33*a*, a lower supporting member 33*b*, and a connecting member 33*c* for connecting both the supporting member 33*a* and the supporting member 33*b*, and for example, the peripheral supporting member 32 is configured such that expansion and contraction of the peripheral supporting member 32 can be manually performed using a tool or the like. Specifically, the connecting member 33*c*, for example, is configured with a screw member rotatable against the pressure force by the upper side plate member 2*b*, and is configured such that by rotating the connecting member 33*c*, the distance between both the supporting member 33*a* and the supporting member 33*b* is adjusted, by this, bending or distortion of the surface of the set plate 12 is corrected, and therefore, the planarity (horizontality) of the surface of the set plate 12 is maintained.

On the other hand, in the attaching apparatus 1 shown in FIG. 2, the peripheral supporting member 32 is configured with a cylindrical portion 32*a* and a support portion 32*b* which is housed in the cylindrical portion 32*a*. The support portion 32*b* is configured so as to freely relatively expand and contract in the moving direction of the upper side plate member 2*b*, that is, in the vertical direction by going in and out of the cylindrical portion 32*a*. Specifically, the support portion 32*b* is configured to be fixed to a reduction gear 36 having a high gear ratio through a hermetic seal 35 which is fixed to the base 30, pulse-controlled by a control portion 39 described below so as to be capable of decreasing the amount of deflection of the lower side plate member 2*a* by pressing the lower side plate member 2*a* against the pressure force by the upper side plate member 2*b*, that is, be capable of expanding and contracting in a state in which a large torque is applied, and freely expanded and contracted in the unit of 0.1 μm by driving through the reduction gear 36 by a pulse motor 37 via a motor controller 38.

The support portion 32*b* is configured such that by being pulse-controlled by the control portion 39 even when not pressed, the flatness of the surface of the set plate 12 is 1.0 μm or less, that is, bending or distortion of the surface of the set plate 12 is corrected, and by this, the planarity (horizontality) of the surface of the set plate 12 is maintained. Alternatively, the support portion 32*b* may be configured such that when not pressed, instead of being pulse-controlled by the control portion 39, the expansion and contraction are manually performed, for example, using a tool or the like, and by this, bending or distortion of the surface of the set plate 12 is corrected, and therefore, the planarity of the surface of the set plate 12 is maintained. That is, the configuration or method for correcting the bending and distortion of the surface of the set plate 12 when not pressed is not particularly limited, however, it is possible to adopt various configurations or methods as long as they can maintain the planarity of the surface of the set plate 12.

The upper side supporting member 3*b* is connected to a pressurizing device (not shown) for applying a pressure force (applying a load) for pressing a laminate, and is equipped with at least the center supporting member 41 for supporting at least the center portion of the upper side plate member 2*b*. In addition, the upper side supporting member 3*b* fixes the upper side plate member 2*b* such that the surface of the press plate 22 becomes horizontal. Though the diameter of the center supporting member 41 may have strength necessary to support the upper side plate member 2*b* when pressed, the diameter is desirable to be thinner such that the heat of the upper side plate member 2*b* does not escape. The center supporting member 41 is configured to be movable in the vertical direction by driving using a pressurizing device. Therefore, the upper side supporting member 3*b* supports the upper side plate member 2*b* in a freely movable manner to apply pressure force to a laminate.

Moreover, in the attaching apparatuses 1 shown in FIGS. 1 and 2, the upper side supporting member 3*b* is configured to be equipped with only the center supporting member 41, however, in the same manner as the lower side supporting member 3*a*, the upper side supporting member 3*b* may be configured to be further equipped with a peripheral supporting member. That is, the upper side supporting member 3*b* may be configured with the center supporting member 41 and a plurality of peripheral supporting members, which are provided to the center supporting member 41, for supporting portions other than the center portion of the upper side plate member 2*b*. In this configuration, the number of the peripheral supporting member which the upper side supporting member 3*b* has is preferably in a range of 3 to 10, and more preferably 6 or 8 to prevent the heat of the upper side plate member 2*b* from escaping and to support (press) the entire upper side plate member 2*b* in a well-balanced manner. The plurality of the peripheral supporting members may be arranged at the same interval to each other to support (press) the entire upper side plate member 2*b* in a well-balanced manner, that is, so as to be capable of maintaining horizontality of the surface of the press plate 22. Though the diameter of the peripheral supporting member may have strength necessary to decrease the amount of deflection of the upper side plate member 2*b* when pressed, the diameter is desirable to be thinner such that the heat of the upper side plate member 2*b* does not escape.

The peripheral supporting member of the upper side supporting member 3*b* may be configured to have the same configuration as the peripheral supporting member 32 of the lower side supporting member 3*a*. That is, for example, in the attaching apparatus 1 shown in FIG. 2, the peripheral supporting member may be configured with a cylindrical portion and a support portion which is housed in the cylindrical portion. The support portion is configured so as to freely relatively expand and contract in the moving direction of the upper side plate member 2*b*, that is, in the vertical direction by going in and out of the cylindrical portion. Specifically, the support portion of which the tip portion is in contact with (fixed, as necessary), for example, the support plate 24 may be configured to be pulse-controlled at a high gear ratio, for example, by the control portion 39 described below, and freely expanded and contracted in the unit of 0.1 μm by driving by the pulse motor 37 so as to be capable of decreasing the amount of deflection of the upper side plate member 2*b* against the pressure force by the upper side plate member 2*b*, that is, be capable of expanding and contracting in a state in which a large torque is applied.

For example, in the attaching apparatus 1 shown in FIG. 2, the support portion of the upper side supporting member 3*b* is configured such that by being pulse-controlled by the control portion 39 even when not pressed, the flatness of the surface of the press plate 22 is 1.0 μm or less, that is, bending or distortion of the surface of the press plate 22 is corrected, and by this, the planarity (horizontality) of the surface of the press plate 22 is maintained. Alternatively, the support portion may be configured such that when not pressed, instead of being pulse-controlled by the control portion 39, for example, the expansion and contraction are manually performed using a tool or the like, and by this, bending or distortion of the surface of the press plate 22 is corrected, and therefore, the planarity of the surface of the press plate 22 is maintained. That is, the configuration or method for correcting the bending and distortion of the surface of the press plate 22 when not pressed is not particularly limited, and, it is possible to adopt various configurations or methods as long as they can maintain the planarity of the surface of the press plate 22.

Furthermore, the attaching apparatus 1 shown in FIG. 2 is equipped with a detecting portion 40 for detecting the amount of deflection of the plate member 2 caused when a pressure force is applied to a laminate and the control portion 39 for expanding and contracting the peripheral supporting member 32 through the motor controller 38 so as to cancel out the amount of deflection detected by the detecting portion 40. Moreover, in the same manner, the attaching apparatus 1 shown in FIG. 1 also is equipped with a detecting portion (not shown) for detecting the amount of deflection of the plate member 2 caused when a pressure force is applied to a laminate so as to be capable of manually performing expansion and contraction of the peripheral supporting member 32.

Specifically, the detecting portion 40 detects the amount of deflection, for example, using a load cell (load converter) which is a sensor which detects a load applied to the peripheral supporting member 32 for supporting the lower side plate member 2*a* of the plate member 2 and converts the detected load into an electric signal. That is, the detecting portion 40 detects a load applied to each peripheral supporting member 32, and adjusts driving of each pulse motor 37 by setting the amount of movement of the support portion 32*b* to the motor controller 38 through the control portion 39 such that the load becomes uniform. The detecting portion 40 can be configured to be equipped with at least three load cells. The load cell may be a compression type, and any kind of a beam type, a column type, an S-type, and a diaphragm type can be used. The control portion 39 expands and contracts the peripheral supporting member 32 by adjusting driving of each pulse motor 37 through the motor controller 38, for example, by sequence control such that a predetermined pressure to be applied to a laminate is uniformly applied over the entire set plate 12.

In addition, the detecting portion 40 of another example, for example, can also be configured with a sensor (displacement meter) for detecting torque applied to the pulse motor 37 which expands and contracts the peripheral supporting member 32, instead of being equipped with a load cell. In this case, the control portion 39 expands and contracts the peripheral supporting member 32 by adjusting driving of each pulse motor 37 through the motor controller 38 so as to fit in with a pre-set torque value, for example, by sequence control, such that torque applied to a plurality of the pulse motors 37 becomes uniform, that is, such that a predetermined pressure to be applied to a laminate is uniformly applied over the entire set plate 12. An amplifier may be provided between the motor controller 38 and the pulse motor 37 as necessary.

Alternatively, the detecting portion 40 may be configured so as to be capable of detecting the amount of deflection in a non-contact manner by measuring the amount of deflection of the plate member 2, that is, the set plate 12 and the press plate 22 using a laser displacement meter or the like.

The control portion 39 is configured such that a detected value of each detecting portion (sensor for detecting a load cell and torque, a laser displacement meter, or the like) becomes uniform on the basis of the detection results (measurement results) of the detecting portion 40, and expansion and contraction of the support portion 32b (and, in a case where the upper side supporting member 3b is equipped with a peripheral supporting member, the support portion of the peripheral supporting member) of the peripheral supporting member 32 is pulse-controlled. That is, since it is possible to correct by feedback-controlling the amount of deflection of the peripheral portion of the set plate 12 and the peripheral portion of the press plate 22 by the detecting portion 40 and the control portion 39 when a laminate is pressed, that is, a substrate and a support are attached to each other, it is possible to uniformly attach the substrate and the support through an adhesive layer.

In addition, the control portion 39 is configured such that expansion and contraction of the support portion 32b (and, in a case where the upper side supporting member 3b is equipped with a peripheral supporting member, the support portion of the peripheral supporting member) of the peripheral supporting member 32 is pulse-controlled through the pulse motor 37 even when not pressed. That is, in the support portion 32b, the expansion and contraction is pulse-controlled by the control portion 39 such that bending or distortion of the surface of the set plate 12 and the surface of the press plate 22 is corrected, and by this, the planarity (horizontality) of the surface of the set plate 12 and the surface of the press plate 22 is maintained at all times regardless of a pressing operation. Specifically, in the control portion 39, in a case where driving of each pulse motor 37 is adjusted by the amount of displacement of a load or the like, driving of each pulse motor 37 is adjusted by previously setting the amount of movement of the support portion 32b to the motor controller 38. In addition, in the control portion 39, in a case where driving of each pulse motor 37 is adjusted by torque applied to the pulse motor 37, driving of each pulse motor 37 is adjusted by setting a predetermined (previously set) torque value to the motor controller 38. Moreover, the control portion 39 may be configured to remove the pulse control of expansion and contraction of the support portion 32b so as to be capable of manually performing expansion and contraction of the support portion 32b, for example, using a tool or the like, when not pressed.

As shown in FIGS. 1 and 2, the prevention member 27 is a member for preventing a laminate from attaching to the press plate 22 when the lower side plate member 2a and the upper side plate member 2b are separated, after the laminate is pressed. The prevention member 27 is formed of a metal such as stainless steel, and is configured with a pin 27a of which the tip is round and a spring 27b which is biased so as to make the pin 27a protrude from the surface of the press plate 22. The biasing force of the spring 27b is adjusted such that when pressing a laminate, the pin 27a is pushed into the press plate 22, and when the pressing of the laminate is released, the pin 27a protrudes from the surface of the press plate 22. Due to this, the pin 27a is configured so as to prevent the laminate from attaching without scratching the laminate.

The carrying pin 17 is a member for lifting a laminate when carrying the laminate to facilitate carrying operation using a carrying device before and after a pressing operation. The carrying pin 17 is configured of a metal such as stainless steel or the like, of which the tip is formed in a round shape, and is installed movably inside the set plate 12. In addition, movement of the carrying pin 17 is controlled such that when pressing a laminate, for example, by the control portion 39, the carrying pin 17 is housed in the set plate 12, and when the pressing of the laminate is released, the carrying pin 17 protrudes from the surface of the set plate 12. By this, the carrying pin 17 is configured so as to facilitate a carrying operation using a carrying device by lifting a laminate from the surface of the set plate 12 when carrying the laminate without scratching the substrate. Therefore, the carrying pin 17 also has a function of the prevention member.

Moreover, in the above description, though a configuration in which the lower side plate member 2a is fixed, and the upper side plate member 2b is driven vertically by a pressurizing device through the upper side supporting member 3b is described as an example, the attaching apparatus according to the present invention may have a configuration in which the upper side plate member 2b is fixed, and the lower side plate member 2a is driven vertically by a pressurizing device through the lower supporting member 3a, or may have a configuration in which the lower side plate member 2a and the upper side plate member 2b are driven vertically.

[Attaching Method]

Next, a method for attaching a laminate using the attaching apparatus 1 having the above configuration, in particular, the attaching apparatus 1 shown in FIG. 2 will be described. Moreover, in the method for attaching a laminate using the attaching apparatus 1 shown in FIG. 1, the following expansion and contraction of the peripheral supporting member 32 which is automatically performed by the control portion 39 or the like is manually performed, for example, using a tool or the like.

First, to the center of the set plate 12 of the lower side plate member 2a in the attaching apparatus 1 housed in a chamber, for example, a laminate in which a substrate, an adhesive layer, and a support plate are laminated in this order, and the substrate and the support plate are temporarily fixed so as not to be displaced is carried by using a carrying device such as a robot arm, and set such that the substrate side faces downward (carrying process). At this time, the inside of the chamber is a reduced pressure environment. In addition, a pair of plate members 2 is previously heated to 150° C. to 250° C. by a heater device. Furthermore, the support portion 32b (and, in a case where the upper side supporting member 3b is equipped with a peripheral supporting member, the support portion of the peripheral supporting member) of the peripheral supporting member 32 suitably expands and contracts such that bending or distortion of the peripheral portion of the set plate 12 and the peripheral portion of the press plate 22 is corrected, and by this, the planarity (horizontality) of the surface of the set plate 12 and the surface of the press plate 22 is maintained.

Next, the press plate 22 is brought into contact with the support plate by lowering the upper side plate member 2b in the attaching apparatus 1, and by further lowering the upper side plate member 2b, the laminate is pressed and heated (attaching process and heating process). That is, the substrate, the adhesive layer, and the support plate are pressed and heated in a reduced pressure environment. For example, in a case where the diameter of the substrate is 300 mm, as the pressure force, a load of 4 tons to 6 tons is preferably applied over the substrate.

Here, for example, the temperature of the adhesive layer is preferably at least room temperature (23° C.) or higher, and more preferably heated to a temperature of the glass transition temperature (Tg) or higher due to low-temperature adhesiveness (stickiness) of the thermoplastic resin which is an adhesive material of the adhesive layer. By heating the adhesive layer to a temperature of the glass transition temperature of the thermoplastic resin or higher, thermal fluidity of the adhesive layer is improved, and the adhesive layer can be easily deformed. Though the temperature of the contact surface also depends on the material of the adhesive layer, that is, the thermoplastic resin which is an adhesive material, the temperature of the contact surface is preferably in a range of 23° C. to 250° C., and more preferably in a range of 150° C. to 250° C. The heating time, that is, the pressing time is preferably 2 minutes to 4 minutes, and more preferably 2 minutes to 3 minutes. By pressing while heating the substrate and the support plate, the adhesive layer maintains thermal fluidity, and easily deforms according to pressing and uniformly spread. Therefore, it is possible to uniformly attach the substrate and the support plate, and there is no concern that attaching failure will occur.

In addition, in the attaching apparatus 1 according to the present invention, the detecting portion 40 detects the amount of deflection of the plate member 2 in a non-contact manner through the attaching process and the heating process, that is, while the attaching apparatus 1 operates, and the control portion 39 pulse-controls expansion and contraction of the support portion 32*b* (and, in a case where the upper side supporting member 3*b* is equipped with a peripheral supporting member, the support portion of the peripheral supporting member) of the peripheral supporting member 32 on the basis of the detection results (measurement results) of the detecting portion 40. That is, the set plate 12 or the press plate 22 is feedback-controlled such that the amount of deflection of the peripheral portion becomes 1.0 µm or less based on the center portion as a reference. Therefore, it is possible to cancel out the amount of deflection of the plate member 2 caused when the pressure force is applied to a laminate.

Due to this, it is possible to avoid a concern that the substrate may be damaged, and it is possible to uniformly attach a substrate and a support through an adhesive layer. In the attaching apparatus 1 according to the present invention, since the attaching process and the heating process are performed at the same time, it is possible to shorten the attaching time for attaching a substrate and a support compared to a case of performing both processes separately. In addition, since the inside of the chamber is a reduced pressure environment, it is possible to suitably attach without mixing in of bubbles between the adhesive layer, the substrate, and the support plate.

Hereinafter, examples will be described, and the embodiment of the present invention will be described in more detail. Obviously, the present invention is not limited to the examples, and details of the present invention can be varied in many ways. Further, the present invention is not limited to the embodiments above, and may be subjected to various modifications within the scope of the claims. That is, an embodiment derived from a proper combination of technical means disclosed in different embodiments is included in the technical scope of the present invention. Also, the entire contents of documents cited herein are incorporated by reference.

INDUSTRIAL APPLICABILITY

The attaching apparatus according to the present invention can be widely used, for example, in a manufacturing process of a fine semiconductor device.

REFERENCE SIGNS LIST

1 Attaching apparatus
2 Plate member
2*a* Lower side plate member
2*b* Upper side plate member
3 Strut member
3*a* Lower side supporting member
3*b* Upper side supporting member
12 Set plate (portion being in contact with a laminate)
14 Support plate (portion being in contact with a strut member)
17 Carrying pins
22 Press plate (portion being in contact with a laminate)
24 Support plate (portion being in contact with a strut member)
27 Prevention member
31 Center supporting member
32 Peripheral supporting member
37 Pulse motor
38 Motor controller
39 Control portion
40 Detecting portion
41 Center supporting member

What is claimed is:

1. An attaching apparatus for attaching a substrate and a support through an adhesive layer by applying a pressure force to a laminate formed by laminating the substrate, the adhesive layer, and the support for supporting the substrate in this order, comprising:
   a pair of plate members for sandwiching the laminate and applying a pressure force to the laminate; and
   a strut member for supporting the plate member,
   wherein a portion of the plate member being in contact with the laminate is formed of ceramics,
   wherein the plate member is configured such that the portion thereof being in contact with the laminate has a flatness of 1.0 µm or less when the portion is not pressed,
   wherein the strut member is formed of a center supporting member for supporting at least the center portion of the plate member and a plurality of peripheral supporting members for supporting portions other than the center portion of the plate member,
   wherein the plurality of peripheral supporting members are each extendable and contractible, and correct bending or distortion of a surface of the plate member so that the portion of the plate member being in contact with the laminate maintains the flatness of 1.0 µm or less when the portion is not pressed,
   wherein a carrying pin for lifting the laminate when carrying the laminate is installed movably inside the plate member,
   the attaching apparatus further comprising:
   a prevention member for preventing the laminate from attaching to the plate member, the prevention member being provided at the portion of the plate member being in contact with the laminate, wherein the prevention member is given a biasing force so that the prevention member protrudes from the portion of the plate member being in contact with the laminate, wherein the biasing force is adjusted such that when pressing the laminate, the prevention member is pushed into the plate member, and when the pressing of the laminate is released, the prevention member protrudes from the portion of the plate member being in contact with the laminate.

2. The attaching apparatus according to claim 1, wherein the center supporting member is configured so as to support at least one of the pair of plate members in a freely movable manner to apply a pressure force to the laminate.

3. The attaching apparatus according to claim 1, wherein the number of the peripheral supporting members with respect to one plate member is in a range of 3 to 10.

4. The attaching apparatus according to claim 1, wherein the pair of plate members are vertically arranged, and the upper side plate member is supported in a freely movable manner by a strut member.

5. The attaching apparatus according to claim 1, wherein the ceramics is alumina.

6. The attaching apparatus according to claim 1, wherein a portion being in contact with the strut member in the plate member is formed of a metal.

7. The attaching apparatus according to claim 1, wherein the plate member has a heating device.

8. The attaching apparatus according to claim 1, further comprising: a detecting portion for detecting an amount of deflection of the plate member caused when a pressure force is applied to the laminate; and a control portion for expanding and contracting the plurality of peripheral supporting members, wherein the control portion controls expansion and contraction of the plurality of peripheral support members on a basis of a result of detection by the detecting portion when the pressure force is applied to the laminate, so that an amount of deflection of a peripheral portion of the plate member is 1.0 µm or less based on the center portion of the plate member as a reference.

* * * * *